US008536015B2

(12) United States Patent
Scheuerlein et al.

(10) Patent No.: US 8,536,015 B2
(45) Date of Patent: *Sep. 17, 2013

(54) MEMORY CELL THAT INCLUDES A CARBON-BASED MEMORY ELEMENT AND METHODS OF FORMING THE SAME

(75) Inventors: Roy E. Scheuerlein, Cupertino, CA (US); Alper Ilkbahar, San Jose, CA (US); April D. Schricker, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/351,468

(22) Filed: Jan. 17, 2012

(65) Prior Publication Data
US 2012/0119178 A1 May 17, 2012

Related U.S. Application Data

(63) Continuation of application No. 12/418,855, filed on Apr. 6, 2009, now Pat. No. 8,110,476.

(60) Provisional application No. 61/044,399, filed on Apr. 11, 2008.

(51) Int. Cl.
| H01L 21/00 | (2006.01) |
| H01L 21/06 | (2006.01) |
| H01L 29/02 | (2006.01) |
| G11C 11/00 | (2006.01) |

(52) U.S. Cl.
USPC ............... 438/386; 438/2; 438/102; 438/103; 365/148; 257/2; 257/E45.001; 257/E45.002; 257/E45.003; 257/E45.004; 977/712; 977/720; 977/721; 977/723; 977/734; 977/788; 977/789; 977/790; 977/855; 977/943

(58) Field of Classification Search
USPC ..................... 438/2, 102, 103, 386; 365/148; 977/712, 720, 721, 723, 734, 788, 789, 790, 977/855, 943
See application file for complete search history.

(56) References Cited

U.S. PATENT DOCUMENTS

| 4,499,557 A | 2/1985 | Holmberg et al. |
| 4,646,266 A | 2/1987 | Ovshinsky et al. |

(Continued)

FOREIGN PATENT DOCUMENTS

| CN | 101000866 | 7/2007 |
| CN | 101132052 A | 2/2008 |

(Continued)

OTHER PUBLICATIONS

Office Action and Search Report in related Chinese Patent Application No. 200980122112.1 mailed Sep. 5, 2012.

(Continued)

*Primary Examiner* — Fernando L Toledo
*Assistant Examiner* — Karen Kusumakar
(74) *Attorney, Agent, or Firm* — Dugan & Dugan, PC (57) ABSTRACT

In accordance with aspects of the invention, a method of forming a metal-insulator-metal stack is provided. The method includes forming a first conducting layer, forming a resistivity-switching carbon-based material above the first conducting layer, and forming a second conducting layer above the carbon-based material, wherein the carbon-based material has a thickness of not more than ten atomic layers. Other aspects are also described.

25 Claims, 10 Drawing Sheets

(56) References Cited

U.S. PATENT DOCUMENTS

| | | | |
|---|---|---|---|
| 5,915,167 A | 6/1999 | Leedy | |
| 6,072,716 A | 6/2000 | Jacobson et al. | |
| 6,566,278 B1 | 5/2003 | Harvey et al. | |
| 6,753,561 B1* | 6/2004 | Rinerson et al. | 257/295 |
| 6,756,605 B1 | 6/2004 | Reed et al. | |
| 6,900,002 B1 | 5/2005 | Plat et al. | |
| 6,952,030 B2 | 10/2005 | Herner | |
| 7,176,064 B2 | 2/2007 | Herner | |
| 7,220,982 B2 | 5/2007 | Campbell | |
| 7,288,784 B2 | 10/2007 | Moore et al. | |
| 7,309,616 B2* | 12/2007 | Nagashima et al. | 438/3 |
| 7,344,946 B2 | 3/2008 | Moore et al. | |
| 7,348,653 B2 | 3/2008 | Cho et al. | |
| 7,354,631 B2 | 4/2008 | Fuss et al. | |
| 7,608,467 B2 | 10/2009 | Wu et al. | |
| 7,713,592 B2 | 5/2010 | Nguyen et al. | |
| 7,768,016 B2 | 8/2010 | Kreupl | |
| 2002/0064069 A1* | 5/2002 | Goebel et al. | 365/173 |
| 2003/0032305 A1 | 2/2003 | Yau et al. | |
| 2003/0179559 A1 | 9/2003 | Engelhardt et al. | |
| 2004/0023475 A1 | 2/2004 | Bonser et al. | |
| 2005/0006640 A1 | 1/2005 | Jackson et al. | |
| 2005/0035380 A1 | 2/2005 | Derycke et al. | |
| 2005/0074956 A1 | 4/2005 | Autryve et al. | |
| 2005/0148174 A1 | 7/2005 | Unger et al. | |
| 2006/0038212 A1 | 2/2006 | Moore et al. | |
| 2006/0250836 A1 | 11/2006 | Herner et al. | |
| 2007/0007579 A1 | 1/2007 | Scheuerlein et al. | |
| 2007/0021293 A1 | 1/2007 | Furukawa et al. | |
| 2007/0190722 A1 | 8/2007 | Herner | |
| 2007/0202610 A1* | 8/2007 | Chiang et al. | 436/518 |
| 2008/0070162 A1 | 3/2008 | Ufert | |
| 2008/0099752 A1 | 5/2008 | Kreupl et al. | |
| 2008/0102278 A1 | 5/2008 | Kreupl et al. | |
| 2008/0237599 A1 | 10/2008 | Herner et al. | |
| 2008/0239790 A1 | 10/2008 | Herner et al. | |
| 2009/0168491 A1 | 7/2009 | Schricker | |
| 2009/0256132 A1 | 10/2009 | Scheuerlein | |
| 2010/0032639 A1 | 2/2010 | Xu | |
| 2010/0032643 A1 | 2/2010 | Xu | |
| 2010/0181546 A1 | 7/2010 | Yamamoto et al. | |
| 2011/0287270 A1 | 11/2011 | Tsurumi et al. | |

FOREIGN PATENT DOCUMENTS

| | | |
|---|---|---|
| EP | 1 763 037 | 3/2007 |
| EP | 1763037 A1 | 3/2007 |
| EP | 1 892 722 A | 2/2008 |
| EP | 1 916 722 | 4/2008 |
| KR | 20090011933 | 2/2009 |
| WO | WO 98/45847 | 10/1998 |
| WO | WO 2004/052781 A | 6/2004 |
| WO | WO 2004/070735 | 8/2004 |
| WO | WO 2005/019104 | 3/2005 |
| WO | WO 2007/008902 | 1/2007 |
| WO | WO 2008/021900 | 2/2008 |
| WO | WO 2008/082897 | 7/2008 |
| WO | WO 2008/118486 | 10/2008 |
| WO | WO 2009/126871 | 10/2009 |
| WO | WO 2009/126876 | 10/2009 |
| WO | WO 2009/134603 | 11/2009 |

OTHER PUBLICATIONS

International Search Report and Written Opinion of International Application No. PCT/US2009/040183 mailed Jul. 16, 2009.

Gerstner et al., "Nonvolatile Memory Effects in Nitrogen Doped Tetrahedral Amorphous Carbon Thin Films" Jour. Applied Physics, vol. 84, No. 10, pp. 5647-5651 (1998).

Office Action of U.S. Appl. No. 12/418,855 mailed Oct. 15, 2010.

EPO Rule 161(1) and 162 Communication of EP Patent Application No. 09729975.4 dated Nov. 22, 2010.

Dec. 23, 2010 Response to EPO Communication of EP Patent Application No. 09729975.4 dated Nov. 22, 2010.

Jan. 14, 2011 Response to Office Action of U.S. Appl. No. 12/418,855 mailed Oct. 15, 2010.

Final Office Action of U.S. Appl. No. 12/418,855 mailed May 12, 2011.

Abbaschian et al. "Physical Metalurgy Principles, 4th edition", 2009, Cengage Learning, Stamford CT, p. 263.

Notice of Allowance of U.S. Appl. No. 12/418,855 mailed Oct. 3, 2011.

Amendment After Final Submitted with RCE of U.S. Appl. No. 12/418,855, filed Aug. 12, 2011.

Office Action of related European Patent Application No. 09729975.4 issued Feb. 13, 2012.

Lemme, M., et al., "A Graphene Field-Effect Device", IEEE Electron Device Letters, vol. 28, No. 4, Apr. 2007.

Jun. 20, 2012 Reply to Office Action of related European Patent Application No. 09729975.4.

Jan. 23, 2013 Response to Sep. 5, 2012 Office Action and Search Report in related Chinese Patent Application No. 200980122112.1.

Office Action in related Chinese Patent Application No. 200980122112.1 dated May 2, 2013.

* cited by examiner

MEMORY CELL THAT INCLUDES A CARBON-BASED MEMORY ELEMENT AND METHODS OF FORMING THE SAME

CROSS-REFERENCE TO RELATED APPLICATIONS

This application is a continuation of U.S. patent application Ser. No. 12/418,855, filed Apr. 6, 2009, now U.S. Pat. No. 8,110,476, which claims the benefit of U.S. Provisional Patent Application Ser. No. 61/044,399, filed Apr. 11, 2008, and titled "Thin Deposited Carbon Switchable Resistor And Diode Matrix Cell For 3D Arrays," each of which is hereby incorporated by reference herein in its entirety for all purposes.

FIELD OF THE INVENTION

This invention relates to non-volatile memories, and more particularly to a memory cell that includes a carbon-based memory element, and methods of forming the same.

BACKGROUND

Non-volatile memories formed from reversible resistance switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), which is hereby incorporated by reference herein in its entirety for all purposes, describes a rewriteable non-volatile memory cell that includes a diode coupled in series with a carbon-based reversible resistivity switching material.

However, fabricating memory devices from carbon-based materials is technically challenging, and improved methods of forming memory devices that employ carbon-based materials are desirable.

SUMMARY

In accordance with a first aspect of the invention, a method of forming a metal-insulator-metal stack is provided. The method includes forming a first conducting layer, forming a resistivity-switching carbon-based material above the first conducting layer, and forming a second conducting layer above the carbon-based material. The carbon-based material has a thickness of not more than ten atomic layers.

In accordance with a second aspect of the invention, a method of forming a metal-insulator-metal is provided. The method includes forming a first conducting layer, forming a resistivity-switching carbon-based material above the first conducting layer, and forming a second conducting layer above the carbon-based material. Forming the carbon-based material includes repeatedly performing the following steps: forming a layer of the carbon-based material, the layer having a thickness of about one monolayer, and subjecting the layer of carbon-based material to a thermal anneal.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Certain carbon-based films, including but not limited to graphene, amorphous carbon ("aC") containing microcrystalline or other regions of graphene, other graphitic carbon films, etc., may exhibit resistivity switching properties that may be used to form microelectronic non-volatile memories. Such films therefore are candidates for integration within a three-dimensional memory array.

Indeed, carbon-based materials have demonstrated memory switching properties on lab-scale devices with a 100×separation between ON and OFF states and mid-to-high range resistance changes. Such a separation between ON and OFF states renders carbon-based materials viable candidates for memory cells in which the carbon-based material is coupled in series with vertical diodes, thin film transistors or other steering elements. For example, a metal-insulator-metal ("MIM") stack formed from a carbon-based material sandwiched between two metal or otherwise conducting layers may serve as a resistance-switching element for a memory cell.

Carbon-based materials are often deposited using plasma-enhanced chemical vapor deposition ("PECVD") techniques. Such carbon-based material may have an "initial resistivity" (i.e., the resistivity of the material as formed) that may be low relative to the resistivities of the surrounding materials. As a result, a resistance-switching element that includes the carbon-based material may conduct a high initial current that is incompatible with a steering element used to control current flow through the resistance-switching element, such as an adjacent diode. Additionally or alternatively, the initial resistivity of the carbon-based material may require a high voltage and current to reset the material upon initial use.

In accordance with an exemplary embodiment of this invention, a memory cell is formed that includes a MIM stack that includes a carbon-based material, and that is coupled to a steering element such as a diode. The memory cell is formed by depositing a thin layer of carbon-based material having a thickness of about ten atomic layers or fewer.

In accordance with another exemplary embodiment of this invention, a memory cell is formed that includes a MIM stack that includes a carbon-based material, and that is coupled to a steering element such as a diode. The memory cell is formed by performing multiple depositions to form multiple monolayers or near-monolayers of a carbon-based material. As used herein, a monolayer of a carbon-based material is about one atomic layer of the carbon-based material. After each monolayer of carbon-based material is formed, the material is annealed at processing temperatures less than about 600° C. before forming the next and successive layer. Subjecting each respective layer to an anneal may facilitate formation of in-plane carbon bonds and limit the number of out-of-plane carbon bonds, thereby increasing the resistivity of the carbon-based material to current flowing in a direction perpendicular to the material's surface. Increasing the resistivity of the carbon-based material in this way may increase the resistance of the reversible-resistance switching element formed from the carbon-based material, thereby decreasing initial current flow through the reversible-resistance switching element.

Exemplary Inventive Memory Cell

Figure 1:
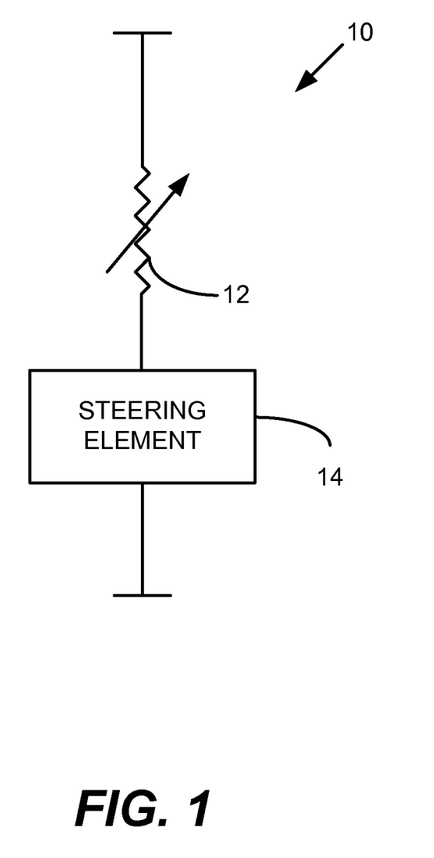
FIG. 1 is a diagram of an exemplary memory cell in accordance with this invention.

FIG. 1 is a schematic illustration of an exemplary memory cell 10 in accordance with this invention. Memory cell 10 includes a reversible resistance switching element 12 coupled to a steering element 14. Reversible resistance switching element 12 includes a reversible resistivity switching material (not separately shown) having a resistivity that may be reversibly switched between two or more states.

For example, reversible resistivity switching material of element 12 may be in an initial, low-resistivity state upon fabrication. Upon application of a first voltage and/or current, the material is switchable to a high-resistivity state. Application of a second voltage and/or current may return reversible resistivity switching material to a low-resistivity state. Alternatively, reversible resistance switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1", although more than two data/resistance states may be used. Numerous reversible resistivity switching materials and operation of memory cells employing reversible resistance switching elements are described, for example, in U.S. patent application Ser. No. 11/125,939, filed May 9, 2005 and titled "Rewriteable Memory Cell Comprising A Diode And A Resistance Switching Material" (the "'939 Application"), which is hereby incorporated by reference herein in its entirety for all purposes.

Steering element 14 may include a thin film transistor, a diode, metal-insulator-metal tunneling current device, or another similar steering element that exhibits non-ohmic conduction by selectively limiting the voltage across and/or the current flow through reversible resistance switching element 12. In this manner, memory cell 10 may be used as part of a two or three dimensional memory array and data may be written to and/or read from memory cell 10 without affecting the state of other memory cells in the array.

Exemplary embodiments of memory cell 10, reversible resistance switching element 12 and steering element 14 are described below with reference to FIGS. 2A-2D and FIG. 3.

Exemplary Embodiments of Memory Cells and Memory Arrays

Figure 2A:
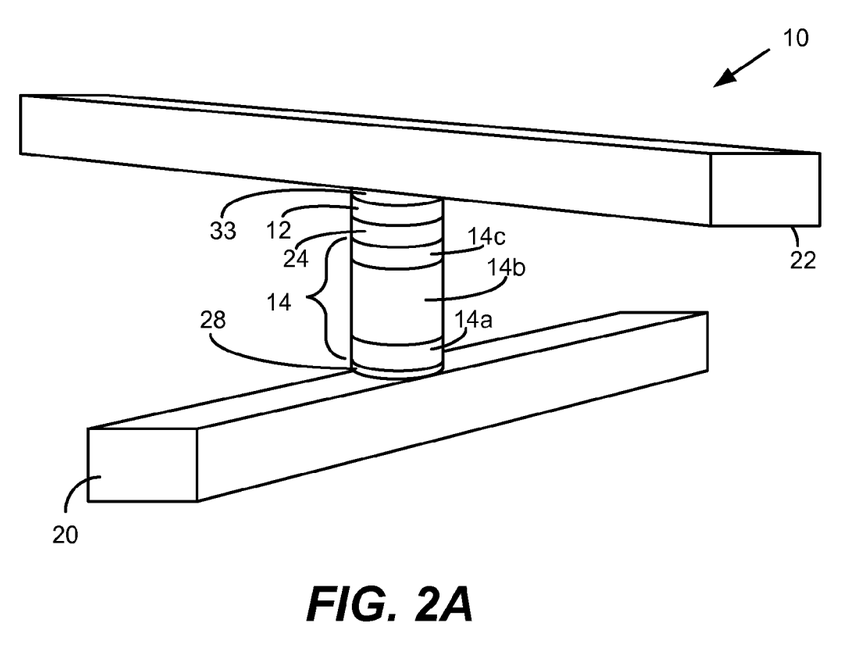
FIG. 2A is a simplified perspective view of an exemplary memory cell in accordance with this invention.

FIG. 2A is a simplified perspective view of an exemplary embodiment of a memory cell 10 in accordance with this invention that includes a steering element 14 and a carbon-based reversible resistance switching element 12. Reversible resistance switching element 12 is coupled in series with steering element 14 between a first conductor 20 and a second conductor 22. In some embodiments, a barrier layer 24 may be formed between reversible resistance switching element 12 and steering element 14, and a barrier layer 33 may be formed between reversible resistance switching element 12 and second conductor 22. An additional barrier layer 28 also may be formed between steering element 14 and first conductor 20. For example, barrier layers 24, 28 and 33 may include titanium nitride, tantalum nitride, tungsten nitride, or other similar barrier layer.

As discussed above, steering element 14 may include a thin film transistor, a diode, metal-insulator-metal tunneling current device, or another similar steering element that exhibits non-ohmic conduction by selectively limiting the voltage across and/or the current flow through reversible resistance switching element 12. In the example of FIG. 2A, steering element 14 is a diode. Accordingly, steering element 14 is sometimes referred to herein as "diode 14."

Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed. Exemplary embodiments of diode 14 are described below with reference to FIG. 3.

Reversible resistance switching element 12 may include a carbon-based material (not separately shown) having a resistivity that may be reversibly switched between two or more states. For example, reversible resistance switching element 12 may include aC containing microcrystalline or other regions of graphene. For simplicity, reversible resistance switching element 12 will be referred to in the remaining discussion as "carbon element 12."

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

Figure 2B:
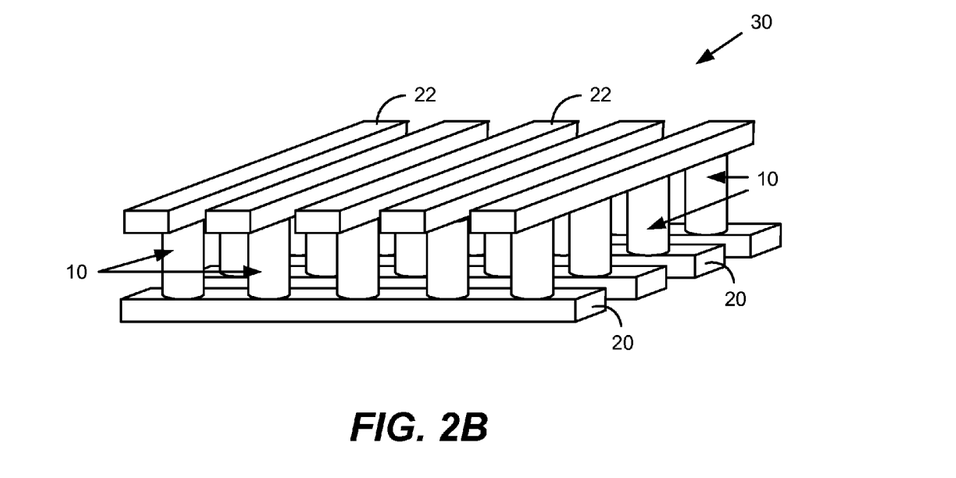
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cell 10 of FIG. 2A. For simplicity, carbon element 12, diode 14, and barrier layers 24, 28 and 33 are not separately shown. Memory array 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
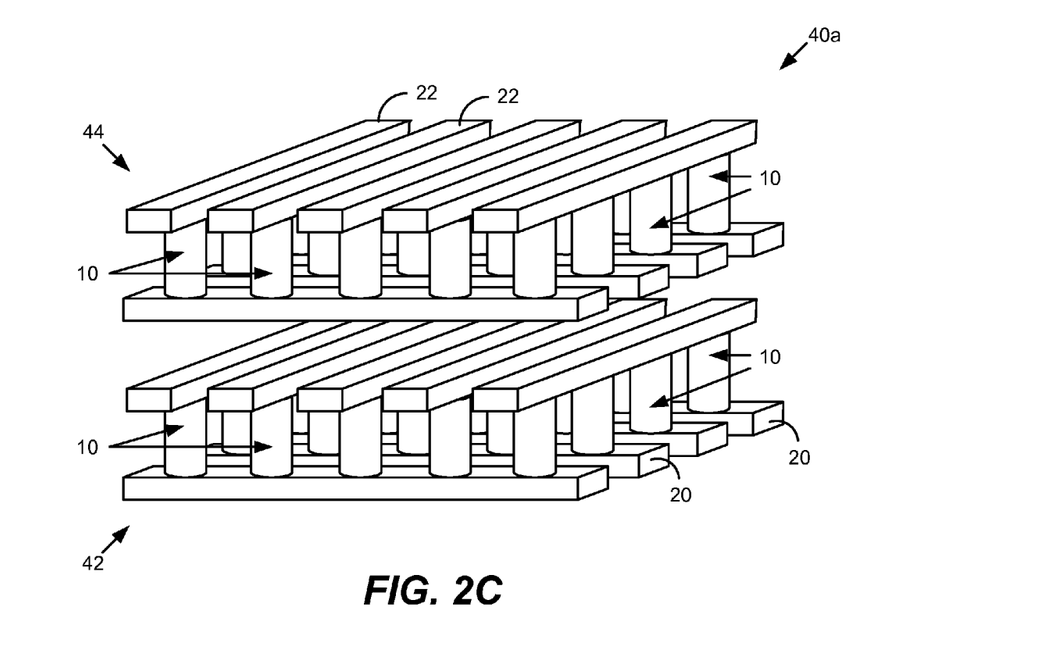
FIG. 2C is a simplified perspective view of a portion of a first exemplary three-dimensional memory array in accordance with this invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
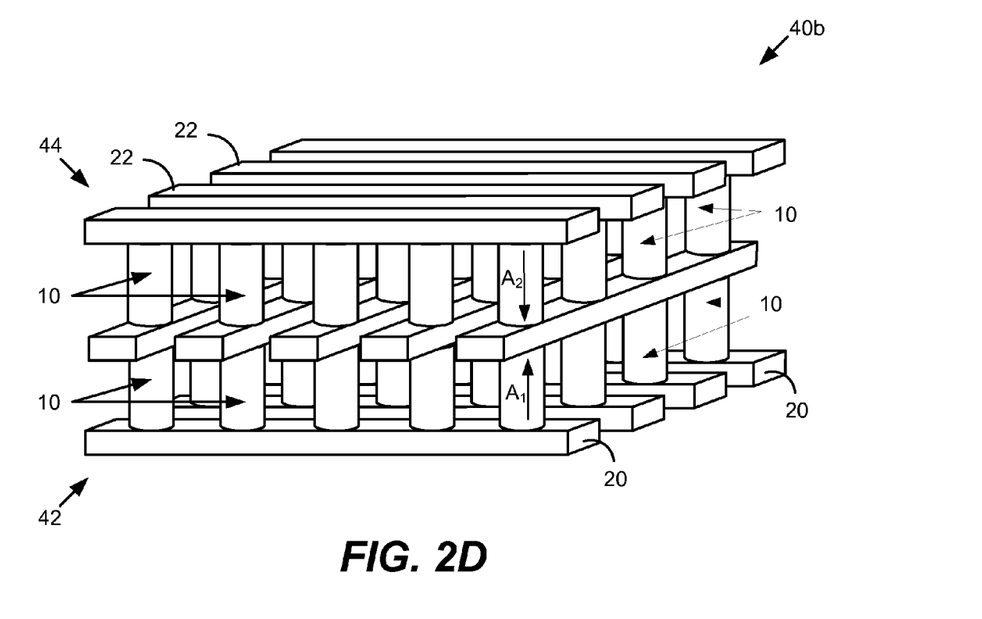
FIG. 2D is a simplified perspective view of a portion of a second exemplary three-dimensional memory array in accordance with this invention.

For example, in some embodiments, the memory levels may be formed as described in U.S. Pat. No. 6,952,030, titled "High-Density Three-Dimensional Memory Cell" which is hereby incorporated by reference herein in its entirety for all purposes. For instance, the upper conductors of a first memory level may be used as the lower conductors of a second memory level that is positioned above the first memory level as shown in the alternative exemplary three dimensional array 40b illustrated in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (hereinafter "the '151 Application"), which is hereby incorporated by reference herein in its entirety for all purposes. For example, as shown in FIG. 2D, the diodes of the first memory level 42 may be upward pointing diodes as indicated by arrow A1 (e.g., with p regions at the bottom of the diodes), whereas the diodes of the second memory level 44 may be downward pointing diodes as indicated by arrow A2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

As previously stated, any suitable carbon-based switching material may be used as carbon element 12. In some embodiments, a preferred resistivity of the material used to form carbon element 12 is at least $1\times10^1$ ohm-cm when carbon element 12 is in an ON-state, whereas a preferred resistivity of the material used to form carbon element 12 is at least $1\times10^3$ ohm-cm when carbon element 12 is in an OFF-state.

Figure 3:
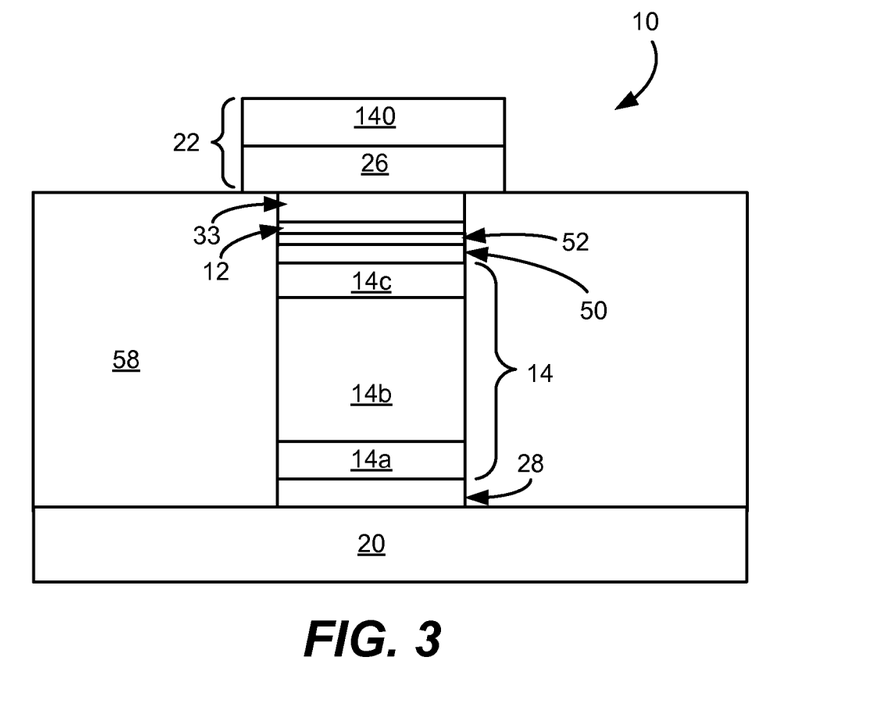
FIG. 3 is a cross-sectional view of an exemplary embodiment of a memory cell in accordance with this invention.

FIG. 3 is a cross-sectional view of an exemplary embodiment of memory cell 10 of FIG. 1. In particular, FIG. 3 shows an exemplary memory cell 10 which includes carbon element 12, diode 14, and first and second conductors 20 and 22, respectively. Memory cell 10 may also include barrier layers 26, 28, and 33, a silicide layer 50, a silicide-forming metal layer 52, and dielectric layer 58, as well as adhesion layers, antireflective coating layers and/or the like (not shown) which may be used with first and/or second conductors 20 and 22, respectively, to improve device performance and/or facilitate device fabrication.

In FIG. 3, diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (hereinafter "the '331 Application"), which is hereby incorporated by reference herein in its entirety for all purposes. In some embodiments, a few hundred angstroms or less of silicon-germanium alloy with about 10 at % or more of germanium may be employed.

A barrier layer 28, such as titanium nitride, tantalum nitride, tungsten nitride, etc., may be formed between the first conductor 20 and the n+ region 14a (e.g., to prevent and/or reduce migration of metal atoms into the polysilicon regions).

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10 as a large voltage is not required to switch the deposited silicon to a low resistivity state. For example, a silicide-forming metal layer 52 such as titanium or cobalt may be deposited on p+ polysilicon region 14c. During a subsequent anneal step (described below) employed to crystallize the deposited silicon that forms diode 14, silicide-forming metal layer 52 and the deposited silicon of diode 14 interact to form silicide layer 50, consuming all or a portion of the silicide-forming metal layer 52. In some embodiments, a nitride layer (not shown) may be formed at a top surface of silicide-forming metal layer 52. For example, if silicide-forming metal layer 52 is titanium, a TiN layer may be formed at a top surface of silicide-forming metal layer 52.

A rapid thermal anneal ("RTA") step may then be performed to form silicide regions by reaction of silicide-forming metal layer 52 with p+ region 14c. The RTA may be performed at about 540° C. for about 1 minute, and causes silicide-forming metal layer 52 and the deposited silicon of diode 14 to interact to form silicide layer 50, consuming all or a portion of the silicide-forming metal layer 52. As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer.

In embodiments in which a nitride layer was formed at a top surface of silicide-forming metal layer 52, following the RTA step, the nitride layer may be stripped using a wet chemistry. For example, if silicide-forming metal layer 52 includes a TiN top layer, a wet chemistry (e.g., ammonium, peroxide, water in a 1:1:1 ratio) may be used to strip any residual TiN.

In at least some embodiments, described in more detail with respect to FIGS. 4A-4E, reversible resistance switching element 12 may be formed by depositing a thin layer of a carbon-based material, such as aC, having a thickness of about ten atomic layers or fewer.

In other embodiments, carbon element 12 may be formed by performing multiple depositions of a carbon-based material, such as aC, to form multiple monolayers or near-monolayers of the carbon-based material and annealing each layer before depositing a successive layer. Forming carbon-based material in this manner may increase the resistivity of the material to current flowing in a direction perpendicular to the material's surface.

Preferably between two and about ten monolayers or near-monolayers are deposited to form carbon element 12. The total thickness of carbon element 12 is between about 1 angstrom and about 800 angstroms, preferably between about 5 angstrom and 100 angstroms.

In particular embodiments, carbon-based switching materials may be formed to exhibit sheet resistance ("$\Omega/\square$" or "ohms/square") for a 1000 angstrom film from about $1\times10^5$ $\Omega/\square$ to about $1\times10^8$ $\Omega/\square$, and more preferably about $1\times10^4$ $\Omega/\square$ or greater. Similarly, some embodiments may comprise an aC film with nanocrystallites. Other film parameters and characteristics may be pursued as well (e.g., alternate values of deposition rate, film thickness, sheet resistance/resistivity, etc.).

A barrier layer 33, such as titanium nitride, tantalum nitride, tungsten nitride, etc., may be formed between carbon element 12 and second conductor 22. Second conductor 22 may be formed above barrier layer 33, as shown in FIG. 3. Second conductor 22 may include one or more barrier and/or adhesion layers 26 and a conductive layer 140.

Exemplary Fabrication Processes for Memory Cells

Referring now to FIGS. 4A-4E, a first exemplary method of forming an exemplary memory level in accordance with this invention is described. In particular, FIGS. 4A-4E illustrate an exemplary method of forming an exemplary memory level including memory cells 10 of FIG. 3. As will be described below, the first memory level includes a plurality of memory cells that each include a steering element and a carbon-based reversible resistance switching element coupled to the steering element. Additional memory levels may be fabricated above the first memory level (as described previously with reference to FIGS. 2C-2D).

Figure 4A:
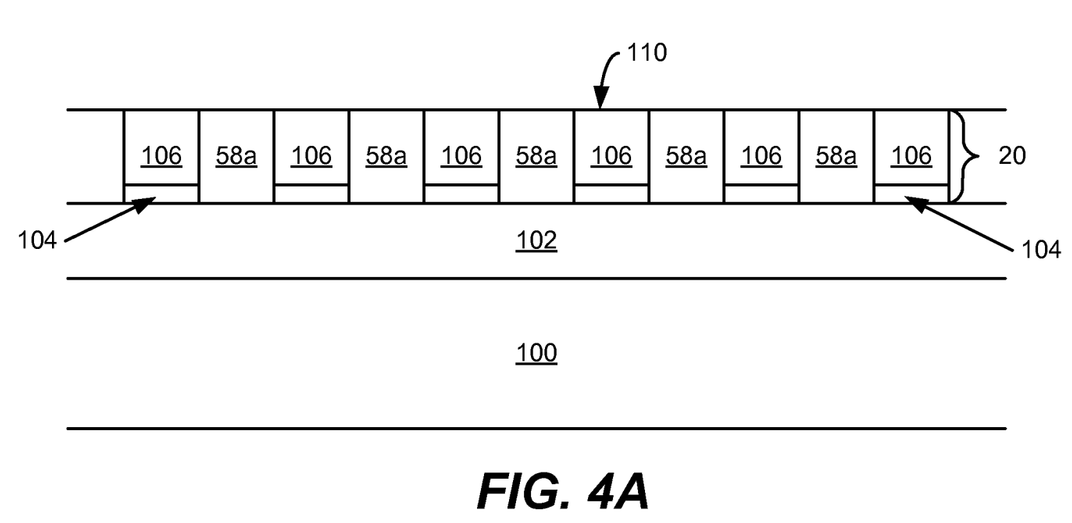
FIGS. 4A-4E illustrate cross-sectional views of a portion of a substrate during an exemplary fabrication of a single memory level in accordance with this invention.

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition or another method). For example, adhesion layer 104 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), physical vapor deposition ("PVD"), etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
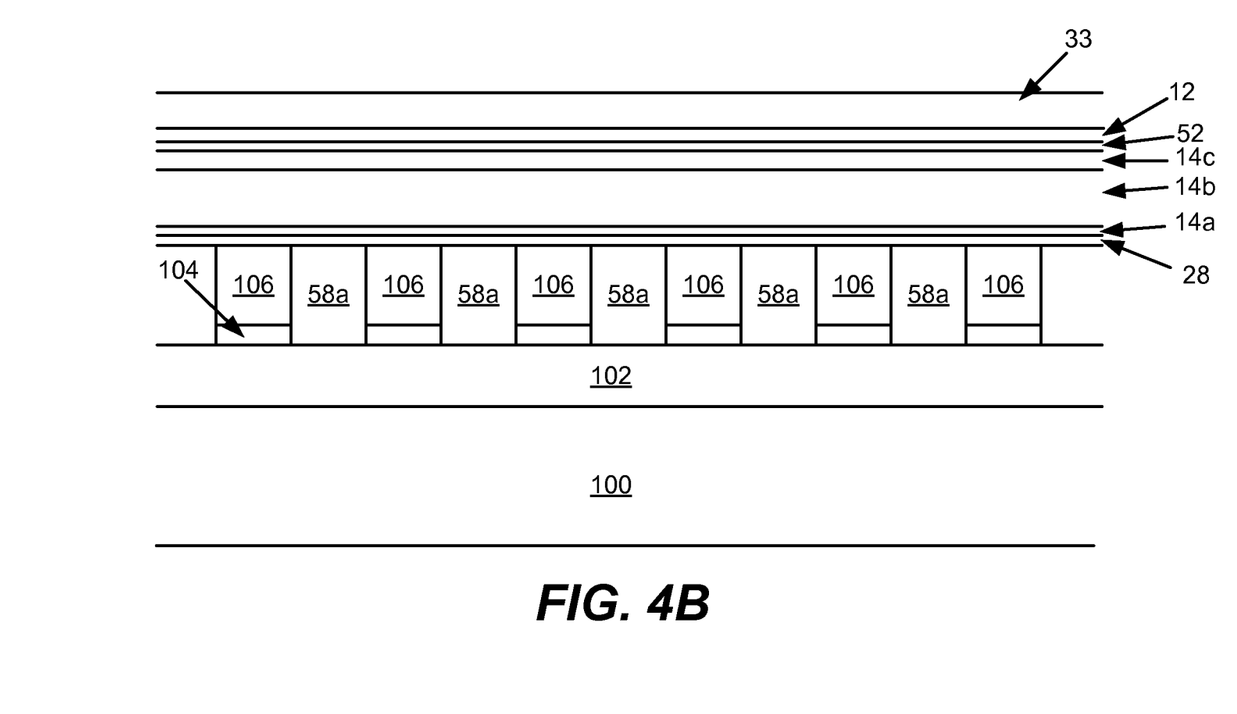

Following planarization, the diode structures of each memory cell are formed. With reference to FIG. 4B, a barrier layer 28 is formed over planarized top surface 110 of substrate 100. Barrier layer 28 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 1 and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 28, a heavily doped n+ silicon layer 14a is deposited on barrier layer 28. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b may be formed over n+ silicon layer 14a. In some embodiments, intrinsic silicon layer 14b may be in an amorphous state as deposited. In other embodiments, intrinsic silicon layer 14b may be in a polycrystalline state as deposited. CVD or another suitable deposition method may be employed to deposit intrinsic silicon layer 14b. In at least one embodiment, intrinsic silicon layer 14b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+silicon layer 14a into intrinsic silicon layer 14b (as described in the '331 Application, previously incorporated).

Heavily doped, p-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Exemplary implantable molecular ions include BF$_2$, BF$_3$, B and the like. In some embodiments, an implant dose of about 1×5× $10^{15}$ ions/cm$^2$ may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 52, an RTA step may be performed at about 540° C. for about one minute to form silicide layer 50, consuming all or a portion of the silicide-forming metal layer 52. Following the RTA step, any residual nitride layer from silicide-forming metal layer 52 may be stripped using a wet chemistry, as described above, and as is known in the art.

Following the RTA step and the nitride strip step, carbon element 12 is formed above silicide-forming metal layer 52. In at least some embodiments described herein, carbon element 12 is formed by depositing a carbon-based reversible resistivity switching material such as aC. In alternative embodiments, other carbon-based materials may be used, including, without limitation, graphene, graphite, etc. For each material, a ratio of sp$^2$ (double carbon-carbon bonds to sp$^3$ (single carbon-carbon bonds) may be determined via, e.g., Raman spectroscopy, by evaluating the D and G bands. The range of usable materials may be identified by a ratio such as $M_yN_z$, where M is the sp$^3$ material and N is the sp$^2$ material, and y and z are any fractional value from zero to one and y+z=1.

As discussed above, carbon element 12 may be formed by depositing a thin layer of aC having a thickness of only a few atomic layers (e.g., approximately ten atomic layers or fewer). Researchers have asserted that depositing a carbon-based material in this manner may facilitate the formation of carbon-carbon ring structures in the carbon-based material. For example, the formation of sp$^2$ carbon-carbon pi bonds typical in graphitic materials may be facilitated.

For example, carbon element 12 may be formed using a plasma enhanced decomposition and deposition procedure, such as PECVD, performed at processing temperatures between about 300° C. and 900° C., preferably below 600° C., more preferably below 450° C., using a mixture of hydrogen and hexane. In other embodiments, other deposition methods may be used, including, without limitation, sputter deposition from a target, CVD, arc discharge techniques and laser ablation.

In other embodiments, carbon element 12 may be formed by performing multiple depositions of an aC material to form multiple monolayers or near-monolayers of the aC material and annealing each respective monolayer or near-monolayer before depositing a successive layer. Forming a carbon-based material in this manner may increase the resistivity of the material to current flowing in a direction perpendicular to the material's surface.

Each monolayer or near-monolayer may be annealed at processing temperatures less than about 600° C. in a non-oxidizing ambient before deposition of the successive layer. Subjecting each respective layer to an anneal may facilitate formation of in-plane carbon bonds and limit the number of out-of-plane carbon bonds, thereby increasing the resistivity of the aC material in the direction perpendicular to the material's surface. Increasing the resistivity of the aC material in this manner may increase the resistance of reversible resistance switching element 12 formed from the aC material, thereby decreasing initial current flow through the reversible-resistance switching element 12.

Preferably between two and about ten layers of aC material are deposited to form reversible resistance switching element 12. The total thickness of reversible resistance switching element 12 is between about 1 angstrom and about 800 angstroms, preferably between about 5 angstrom and 100 angstroms.

A barrier layer 33 is formed over reversible resistance switching element 12. Barrier layer 33 may be about 5 to about 800 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Figure 4C:
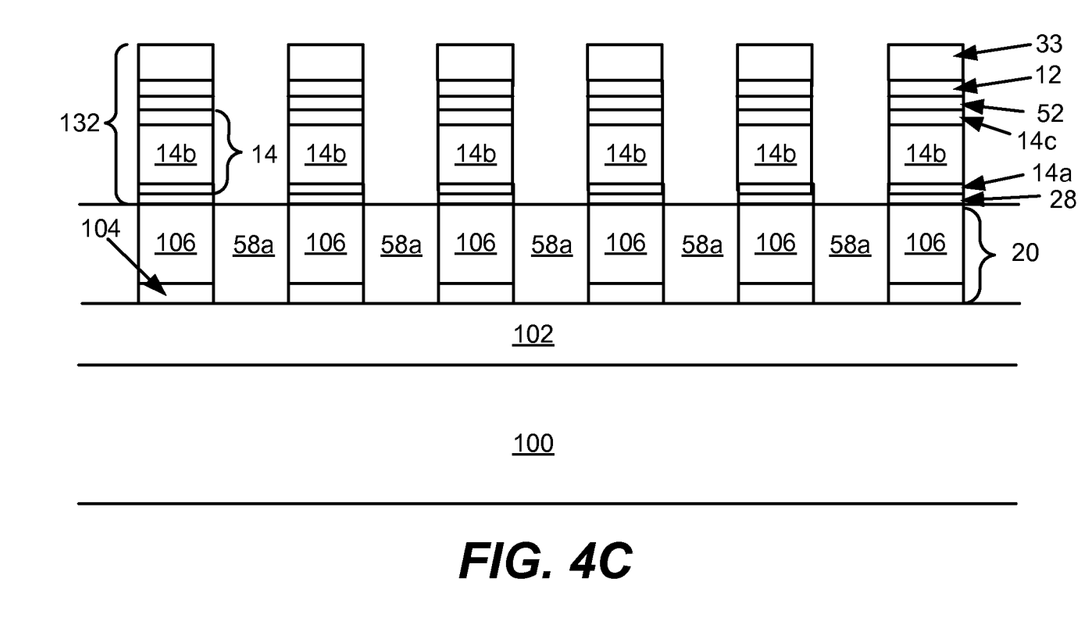
Figure 4D:
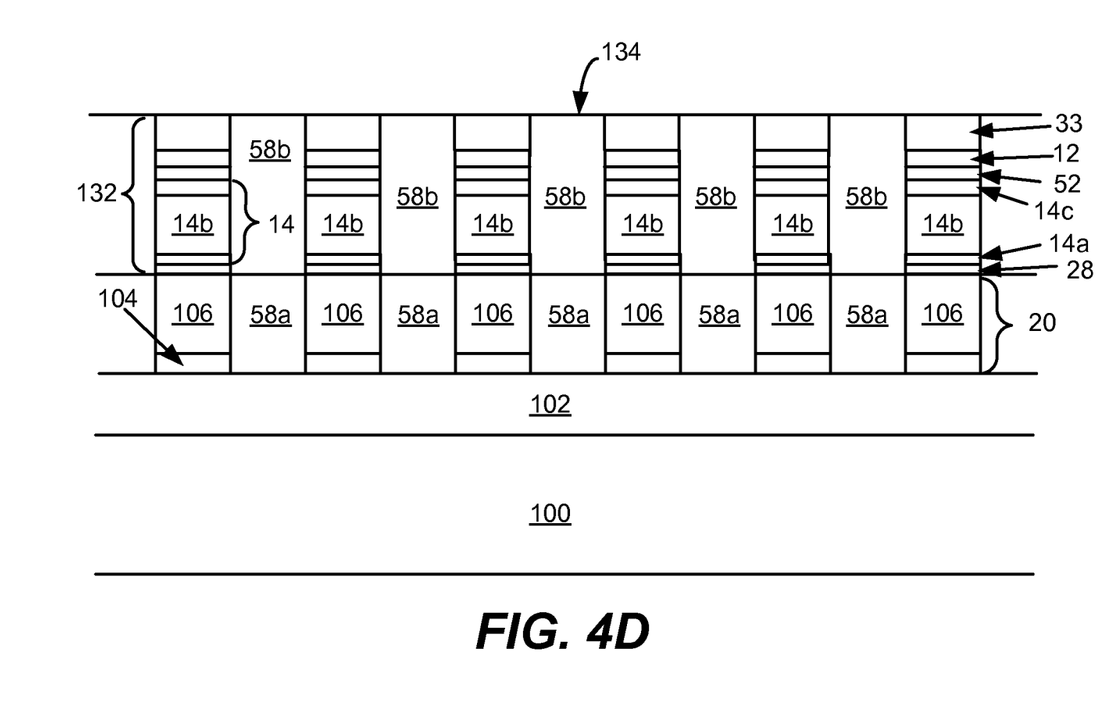

As shown in FIG. 4C, barrier layer 33, reversible resistance switching element 12, silicide-forming metal layer 52, diode layers 14a-14c and barrier layer 28 are patterned and etched to form pillars 132. Pillars 132 may have about the same pitch and about the same width as conductors 20 below, such that each pillar 132 is formed on top of a conductor 20. Some misalignment may be tolerated.

For example, photoresist may be deposited, patterned using standard photolithography techniques, layers 28, 14a-14c, 52, 12, and 33 may be etched, and then the photoresist may be removed. Alternatively, a hard mask of some other material, for example silicon dioxide, may be formed on top of the barrier layer 33, with bottom antireflective coating ("BARC") on top, then patterned and etched. Similarly, dielectric antireflective coating ("DARC") may be used as a hard mask.

Pillars 132 may be formed using any suitable masking and etching process. For example, layers 28, 14a-14c, 52, 12, and 33 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

Any suitable etch chemistries, and any suitable etch parameters, flow rates, chamber pressures, power levels, process temperatures, and/or etch rates may be used. In some embodiments, barrier layer 33, reversible resistance switching element 12, silicide-forming metal layer 52, diode layers 14a-14c and barrier layer 28 may be patterned using a single etch step. In other embodiments, separate etch steps may be used. The etch proceeds down to dielectric layer 58a. Such etched pillars 132 have been observed to have nearly vertical sidewalls and little or no undercut of reversible resistance switching element 12.

After etching pillars 132 may be cleaned using a dilute hydrofluoric/sulfuric acid clean. Such cleaning, whether or not PR asking is performed before etching, may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for 60 seconds. Megasonics may or may not be used.

After pillars 132 have been cleaned, a dielectric layer 58b may be deposited over pillars 132 to fill the voids between pillars 132. For example, approximately 200-7000 angstroms of silicon dioxide may be deposited and planarized using chemical mechanical polishing or an etchback process to remove excess dielectric material 58b and form a planar surface 134, resulting in the structure illustrated in FIG. 4D. Planar surface 134 includes exposed top surfaces of pillars 132 separated by dielectric material 58b (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4E:
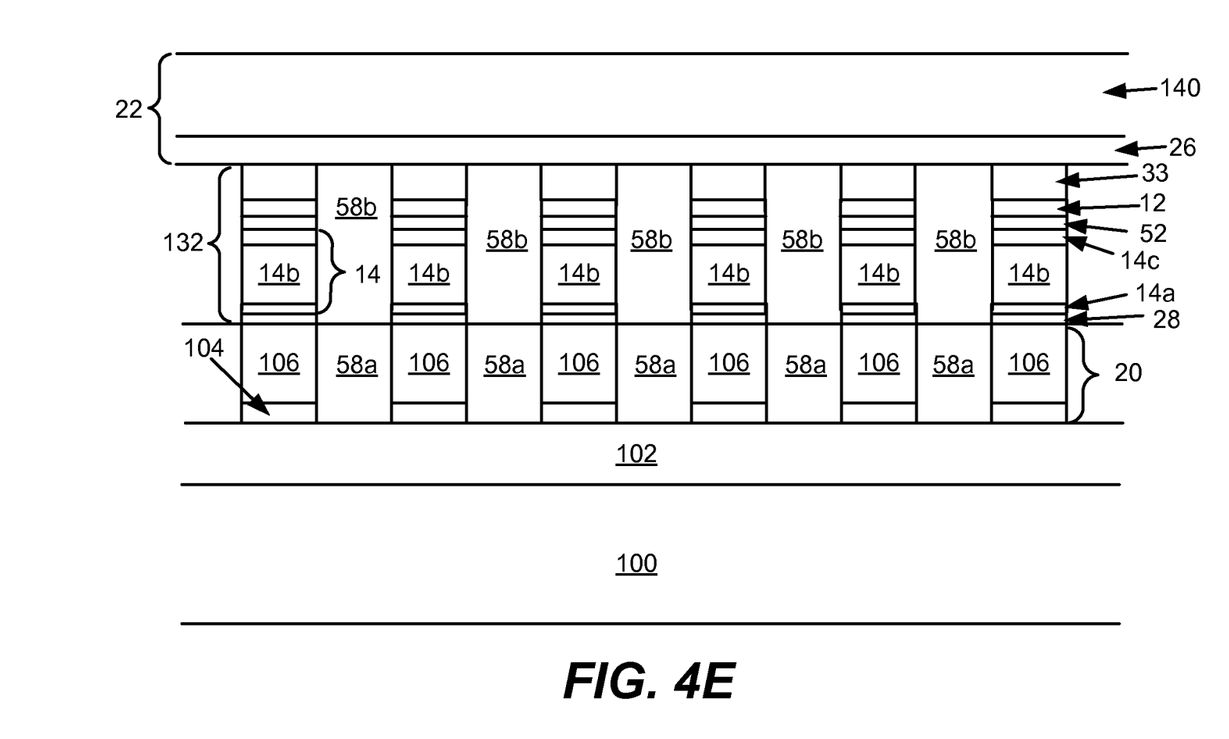

With reference to FIG. 4E, second conductors 22 may be formed above pillars 132 in a manner similar to the formation of first conductors 20. For example, in some embodiments, one or more barrier layers and/or adhesion layers 26 may be deposited over pillars 132 prior to deposition of a conductive layer 140 used to form second conductors 22.

Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 26 may include titanium nitride or another suitable layer such as tantalum nitride, tungsten nitride, combinations of one or more layers, or any other suitable material(s). The deposited conductive layer 140 and barrier and/or adhesion layer 26 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). The lattice spacing of titanium silicide and cobalt silicide are close to that of silicon, and it appears that silicide layers 50 may serve as "crystallization templates" or "seeds" for adjacent deposited silicon as the deposited silicon crystallizes (e.g., silicide layer 50 enhances the crystalline structure of silicon diode 14 during annealing at temps of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Persons of ordinary skill in the art will understand that alternative memory cells in accordance with this invention may be fabricated in other similar techniques. For example, memory cells may be formed that include reversible resistance switching element 12 below diode 14.

The foregoing description discloses only exemplary embodiments of the invention. Modifications of the above disclosed apparatus and methods which fall within the scope of the invention will be readily apparent to those of ordinary skill in the art. For instance, in any of the above embodiments, the carbon-based material may be located below the diodes 14. As stated, although the invention has been described primarily with reference to amorphous carbon, other carbon-based materials may be similarly used. Further, each carbon-based layer is preferably formed between two conducting layers such as titanium nitride or other barrier/adhesion layers to form a MIM stack in series with a steering element.

Accordingly, although the present invention has been disclosed in connection with exemplary embodiments thereof, it should be understood that other embodiments may fall within the spirit and scope of the invention, as defined by the following claims.

The invention claimed is:

1. A method of forming a metal-insulator-metal ("MIM") stack, the method comprising:
    forming a first conducting layer;
    forming a resistivity-switching carbon-based material above the first conducting layer; and
    forming a second conducting layer above the carbon-based material,
    wherein the carbon-based material has a thickness of not more than ten atomic layers.

2. The method of claim 1, wherein the MIM stack comprises a reversible resistance switching element.

3. The method of claim 1, wherein the carbon-based material comprises amorphous carbon.

4. The method of claim 1, wherein forming the carbon-based material comprises depositing the carbon-based material using a plasma enhanced chemical vapor deposition technique.

5. The method of claim 4, wherein the plasma enhanced chemical vapor deposition technique is performed at processing temperatures less than 600° C.

6. The method of claim 4, wherein the plasma enhanced chemical vapor deposition technique is performed at processing temperatures less than 450° C.

7. The method of claim 1, further comprising forming a steering element coupled to the MIM stack.

8. The method of claim 7, wherein the steering element comprises a p-n or p-i-n diode.

9. The method of claim 7, wherein the steering element comprises a polycrystalline diode.

10. The method of claim 1, wherein the MIM stack comprises a memory element.

11. A memory cell formed using the method of claim 1.

12. A method of forming a metal-insulator-metal ("MIM") stack, the method comprising:
 forming a first conducting layer;
 forming a resistivity-switching carbon-based material above the first conducting layer; and
 forming a second conducting layer above the carbon-based material,
 wherein forming the carbon-based material comprises repeatedly performing the following steps:
 forming a layer of the carbon-based material, the layer having a thickness of about one monolayer; and
 subjecting the layer of carbon-based material to a thermal anneal.

13. The method of claim 12, wherein the thermal anneal is performed at processing temperatures less than about 600° C.

14. The method of claim 12, wherein the thermal anneal is performed using a non-oxidizing ambient.

15. The method of claim 12, wherein one monolayer comprises about one atomic layer of the carbon-based material.

16. The method of claim 12, wherein the MIM stack comprises a reversible resistance switching element.

17. The method of claim 12, wherein the carbon-based material comprises amorphous carbon.

18. The method of claim 12, wherein forming the carbon-based material comprises depositing the carbon-based material using a plasma enhanced chemical vapor deposition technique.

19. The method of claim 18, wherein the plasma enhanced chemical vapor deposition technique is performed at processing temperatures less than 600° C.

20. The method of claim 18, wherein the plasma enhanced chemical vapor deposition technique is performed at processing temperatures less than 450° C.

21. The method of claim 12, further comprising forming a steering element coupled to the MIM stack.

22. The method of claim 21, wherein the steering element comprises a p-n or p-i-n diode.

23. The method of claim 21, wherein the steering element comprises a polycrystalline diode.

24. The method of claim 12, wherein the MIM stack comprises a memory element.

25. A memory cell formed using the method of claim 12.

* * * * *